US012615755B2

(12) United States Patent
Tang

(10) Patent No.: US 12,615,755 B2
(45) Date of Patent: Apr. 28, 2026

(54) METHOD FOR FABRICATING SEMICONDUCTOR STRUCTURE AND SEMICONDUCTOR STRUCTURE

(71) Applicant: ChangXin Memory Technologies, Inc., Hefei (CN)

(72) Inventor: Yi Tang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 403 days.

(21) Appl. No.: 18/508,244

(22) Filed: Nov. 14, 2023

(65) Prior Publication Data

US 2024/0090191 A1     Mar. 14, 2024

Related U.S. Application Data

(63) Continuation of application No. PCT/CN2022/124151, filed on Oct. 9, 2022.

(30) Foreign Application Priority Data

Aug. 29, 2022     (CN) .......................... 202211042653.7

(51) Int. Cl.
*H10B 12/00*     (2023.01)
(52) U.S. Cl.
CPC ............. *H10B 12/03* (2023.02); *H10B 12/05* (2023.02); *H10B 12/482* (2023.02); *H10B 12/488* (2023.02)
(58) Field of Classification Search
None
See application file for complete search history.

(56) References Cited

U.S. PATENT DOCUMENTS

2017/0194340 A1*   7/2017   Lue ........................ H10B 41/27
2019/0206890 A1     7/2019   Harari et al.

FOREIGN PATENT DOCUMENTS

CN          112151546 A       12/2020
CN          112635463 A        4/2021
(Continued)

OTHER PUBLICATIONS

ISA State Intellectual Property Office of the People's Republic of China, International Search Report Issued in Application No. PCT/CN2022/124151, Dec. 23, 2022, WIPO, 4 pages.

*Primary Examiner* — Kyoung Lee
(74) *Attorney, Agent, or Firm* — Kilpatrick Townsend & Stockton LLP

(57) ABSTRACT

Embodiments provide a method for fabricating a semiconductor structure and a semiconductor structure. The method includes: providing a substrate; forming, on a surface of the substrate, stacked structures arranged at intervals in a first direction and a first isolation layer located between adjacent stacked structures, the stacked structure including a first interlayer dielectric layer, an initial active layer, and a second interlayer dielectric layer; etching a portion of the initial active layer to form a first trench; forming a metal conductive layer in the first trench, the metal conductive layer being in contact connection with the remained initial active layer; and etching a portion of the metal conductive layer to form lower electrode structures arranged in an array in the first direction and a second direction, where the first direction is perpendicular to the surface of the substrate, and the second direction is parallel to the surface of the substrate.

15 Claims, 12 Drawing Sheets

(56)                    References Cited

FOREIGN PATENT DOCUMENTS

| | | | |
|---|---|---|---|
| CN | 114023703 | A | 2/2022 |
| CN | 114023744 | A | 2/2022 |
| CN | 114597214 | A | 6/2022 |

* cited by examiner

METHOD FOR FABRICATING SEMICONDUCTOR STRUCTURE AND SEMICONDUCTOR STRUCTURE

CROSS-REFERENCE TO RELATED APPLICATION

The present disclosure is a continuation of PCT/CN2022/124151, filed on Oct. 9, 2022, which claims priority to Chinese Patent Application No. 202211042653.7, entitled "METHOD FOR FABRICATING SEMICONDUCTOR STRUCTURE AND SEMICONDUCTOR STRUCTURE", filed on Aug. 29, 2022, which is incorporated herein by reference in its entirety.

TECHNICAL FIELD

Embodiments of the present disclosure relate to the field of semiconductors, and in particular, to a method for fabricating a semiconductor structure and a semiconductor structure.

BACKGROUND

With continuous development of semiconductor structures, their critical dimensions continue to decrease. However, due to limitations of lithography machines, the decrease of their critical dimensions is limited. Therefore, how to make a chip with higher storage density on a wafer is a research direction for many researchers and semiconductor practitioners. In a two-dimensional or planar semiconductor device, memory cells are arranged horizontally, so the integration density of the two-dimensional or planar semiconductor device may be determined by the area occupied by a unit of memory cells. The integration density of the two-dimensional or planar semiconductor device is greatly influenced by the technology of forming fine patterns, which limits the continuous increase in the integration density of the two-dimensional or planar semiconductor device. Therefore, the development of semiconductor devices is moving towards three-dimensional semiconductor devices.

However, the three-dimensional semiconductor devices are still pursuing better performance.

SUMMARY

Embodiments of the present disclosure provide a method for fabricating a semiconductor structure, which can improve at least performance of the semiconductor structure, and a semiconductor structure.

According to some embodiments of the present disclosure, one aspect of the embodiments of the present disclosure provides a method for fabricating a semiconductor structure, including: providing a substrate; forming, on a surface of the substrate, stacked structures arranged at intervals in a first direction and a first isolation layer located between adjacent stacked structures, each stacked structure including a first interlayer dielectric layer, an initial active layer, and a second interlayer dielectric layer; etching a portion of the initial active layer to form a first trench; forming a metal conductive layer in the first trench, the metal conductive layer being in contact connection with the remained initial active layer; and etching a portion of the metal conductive layer to form lower electrode structures arranged in an array in the first direction and a second direction, where the first direction is perpendicular to the surface of the substrate, and the second direction is parallel to the surface of the substrate.

According to some embodiments of the present disclosure, the other aspect of the embodiments of the present disclosure further provides a semiconductor structure, including: a substrate; active structures located on a surface of the substrate and arranged at intervals in a first direction and a second direction, the first direction being perpendicular to the surface of the substrate, and the second direction being parallel to the surface of the substrate; lower electrode structures arranged at intervals in the first direction and the second direction, each lower electrode structure being in contact connection with an active structure; and a first isolation layer, the first isolation layer being located between adjacent active structures in the first direction, and a projection of the active structure on the surface of the substrate partially overlapping with that of the first isolation layer on the surface of the substrate.

BRIEF DESCRIPTION OF THE DRAWINGS

One or more embodiments are illustrated through corresponding accompanying drawings, and these illustrations do not constitute limitations on the embodiments. Unless otherwise stated, the accompanying drawings are not limited proportionally. In order to describe the technical solutions in the embodiments of the present disclosure or in the conventional technologies more clearly, the accompanying drawings to be used in the embodiments will be introduced simply. Apparently, the accompanying drawings described below are merely some embodiments of the present disclosure. Those of ordinary skill in the art may obtain other drawings according to these drawings without any creative efforts.

DETAILED DESCRIPTION

Embodiments of the present disclosure provide a method for fabricating a semiconductor structure, in which stacked structures spaced in a first direction and a first isolation layer between adjacent stacked structures are formed on a surface of a substrate, an initial active layer is etched to form a first trench, a metal conductive layer is formed in the first trench, and the metal conductive layer is etched to form lower electrode structures arranged in an array, where the etching of the initial active layer and the formation of the lower electrode structures may reduce a volume of a semiconductor structure and improve spatial utilization of the semiconductor structure.

The embodiments of the present disclosure will be described in detail below with reference to the accompanying drawings. Those of ordinary skill in the art may understand that, in the embodiments of the present disclosure, many technical details are provided for readers to understand the present disclosure better. However, the technical solutions of the present disclosure may still be implemented even without these technical details and various changes and modifications in the following embodiments.

Refer to FIG. 1 to FIG. 22. FIG. 1 to FIG. 22 are schematic structural diagrams corresponding to all steps of a method for fabricating a semiconductor structure according to embodiments of the present disclosure.

Figure 1:
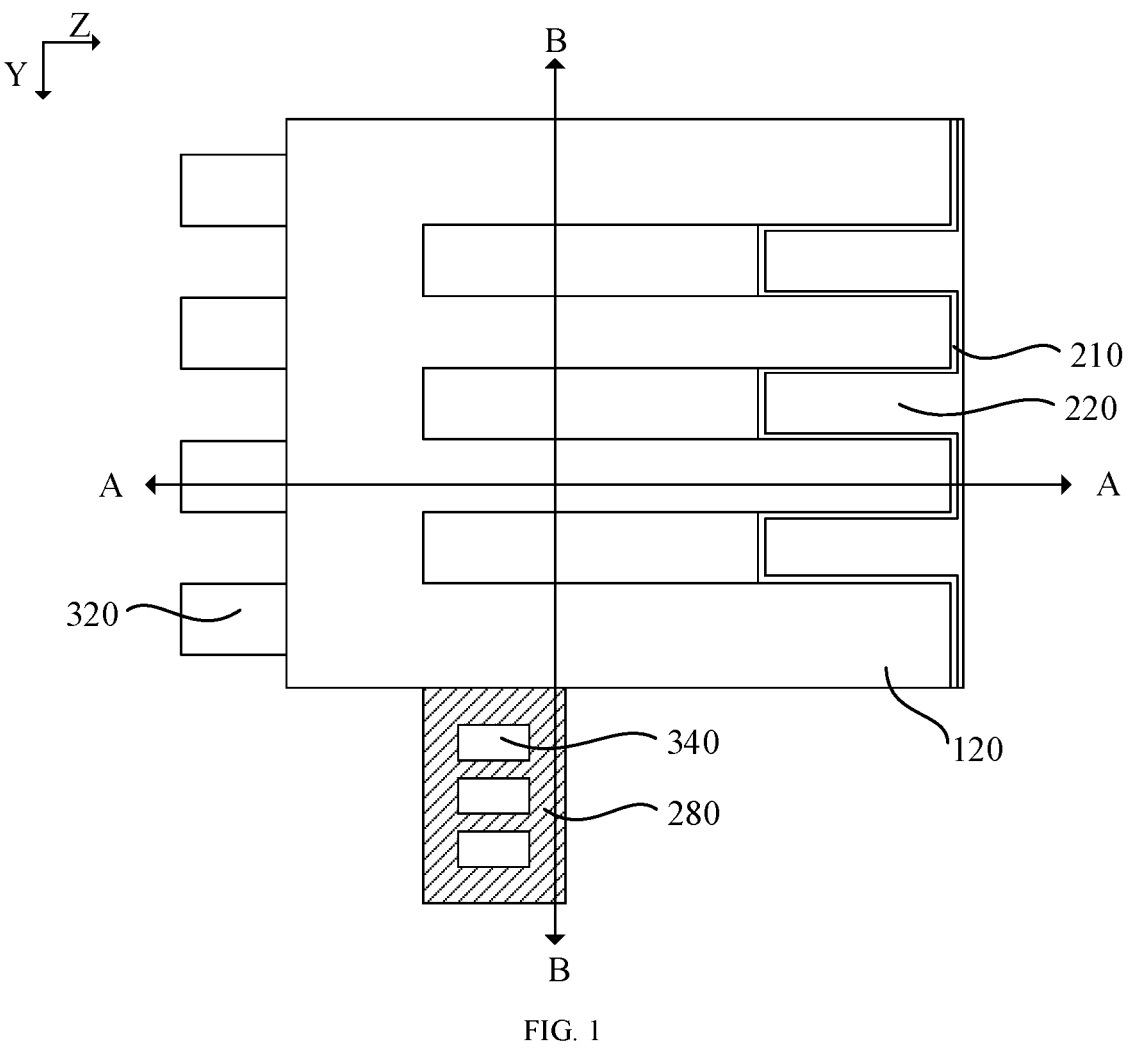
FIGS. 1 to 22 are schematic structural diagrams corresponding to all steps of a method for fabricating a semiconductor structure according to embodiments of the present disclosure.
Figures 2, 3:
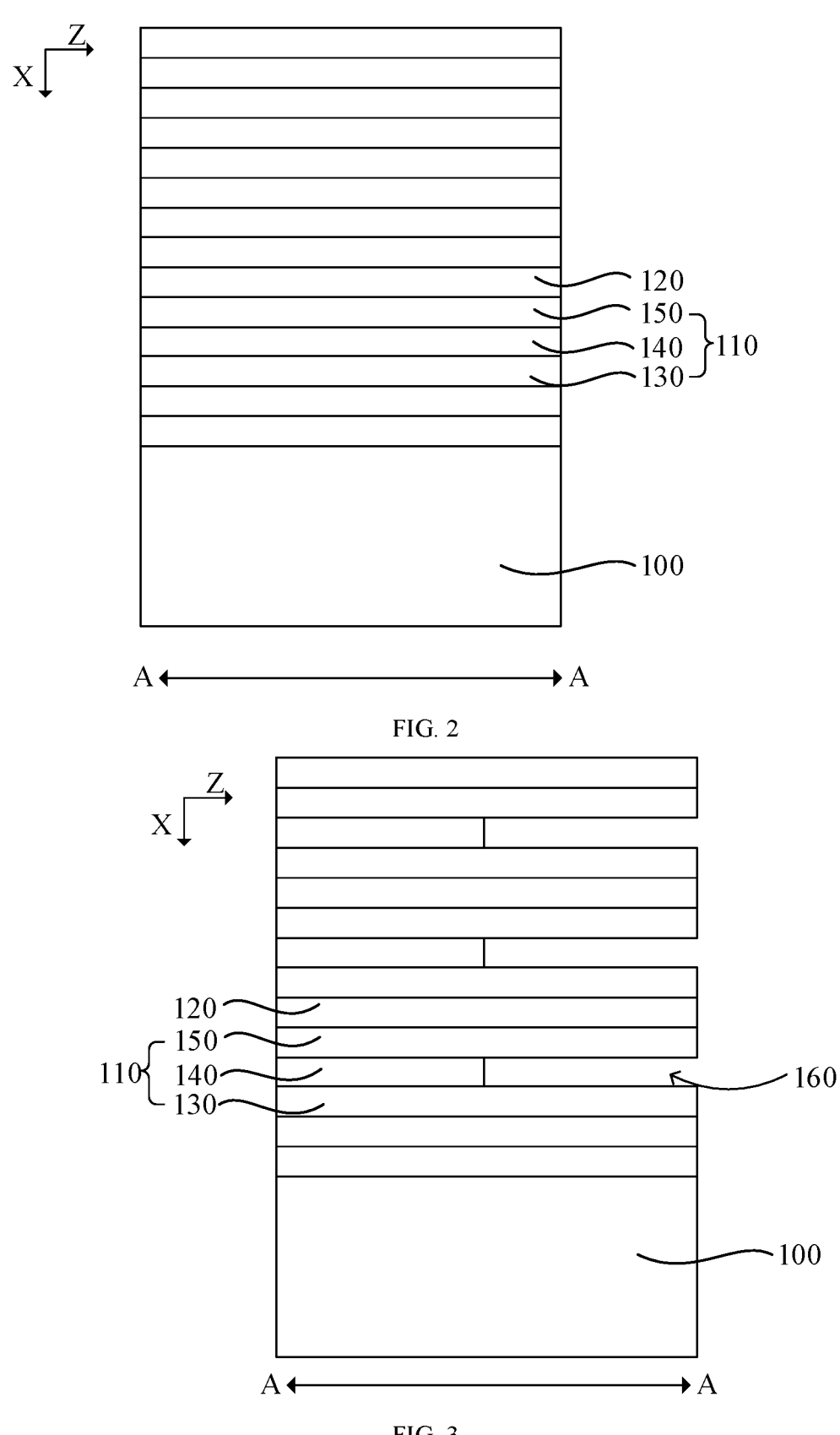

Refer to FIG. 1 and FIG. 2, where FIG. 1 is a top view of a semiconductor structure, and FIG. 2 is a cross-sectional view taken in an AA direction in FIG. 1.

Specifically, a substrate 100 is provided, and stacked structures 110 arranged at intervals in a first direction X and a first isolation layer 120 located between adjacent stacked structures 110 are formed on a surface of the substrate 100, each stacked structure 110 including a first interlayer dielectric layer 130, an initial active layer 140, and a second interlayer dielectric layer 150.

In some embodiments, the substrate 100 is of a semiconductor material, and the semiconductor material includes but is not limited to any one of a silicon substrate, a germanium substrate, a germanium silicon substrate, or a silicon carbide substrate. The substrate 100 may alternatively be an ion doped substrate, and doping ions are N-type ions or P-type ions. The N-type ions may be phosphorus ions, arsenic ions, or antimony ions, and the P-type ions may be boron ions, indium ions, or boron fluoride ions.

In some examples, a material of the first interlayer dielectric layer 130 may be the same as that of the second interlayer dielectric layer 150, and their material may be an insulating material such as silicon oxide. The formation of the first interlayer dielectric layer 130 and the second interlayer dielectric layer 150 provides a basis for subsequent formation of bit lines, and the first interlayer dielectric layer 130 and the second interlayer dielectric layer 150 may further isolate the initial active layer 140 arranged at intervals in the first direction X.

A material of the initial active layer 140 may be a silicon carbide or polycrystalline silicon semiconductor material, and the formation of the initial active layer 140 may provide a process basis for subsequent formation of active structures arranged in an array.

With reference to FIG. 3, a portion of the initial active layer 140 is etched to form a first trench 160. The formation of the first trench 160 may provide a process basis for subsequent formation of lower electrode structures.

In some embodiments, the portion of the initial active layer 140 may be etched in a wet etching manner through side walls of the stacked structures 110.

Figures 4, 5:
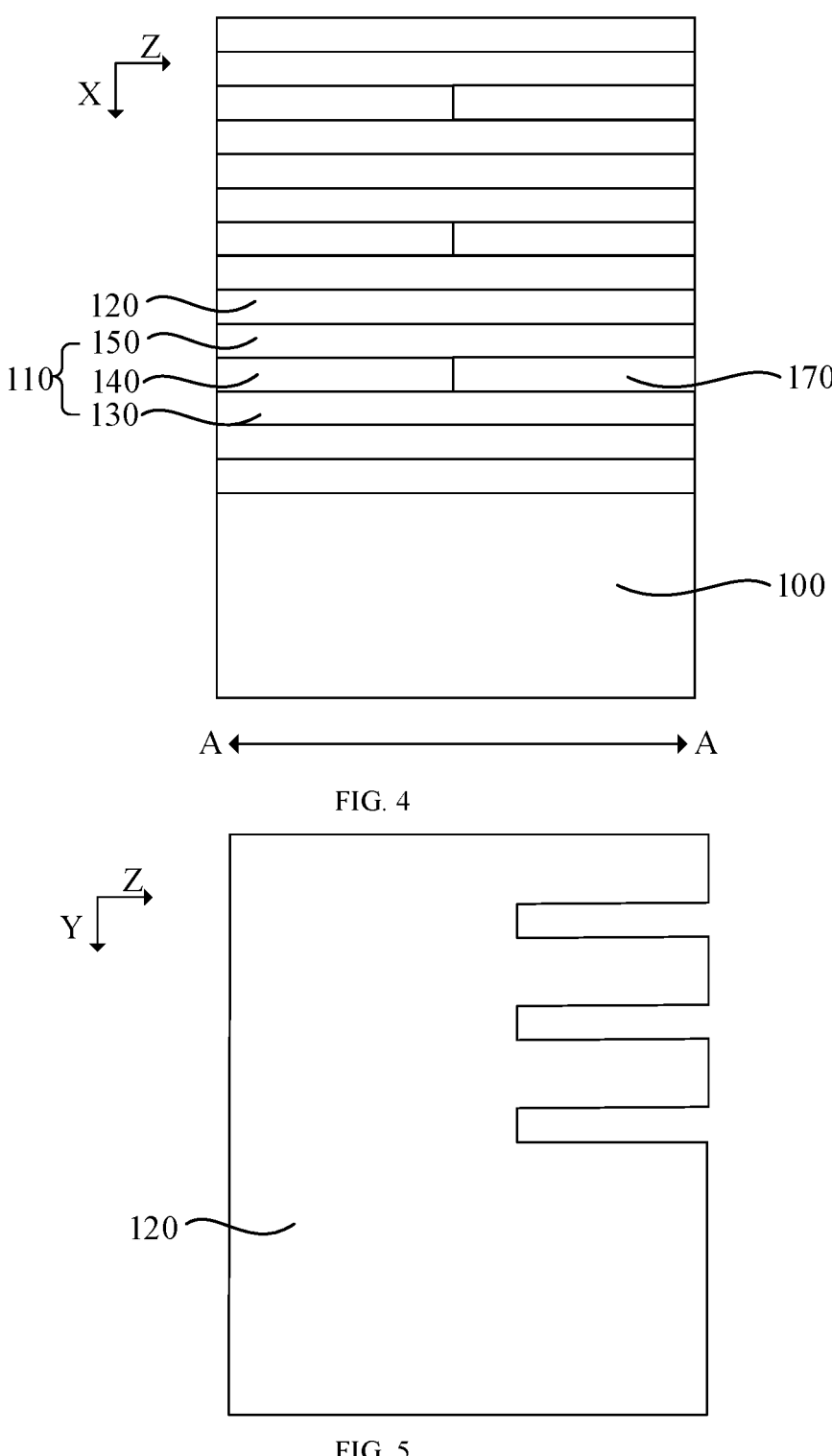

With reference to FIG. 4, a metal conductive layer 170 is formed in the first trench 160. The metal conductive layer 170 is in contact connection with the remained initial active layer 140, and the metal conductive layer 170 may serve as a lower electrode structure.

In some embodiments, the metal conductive layer 170 includes one or more metal materials of titanium, nickel, tungsten, and titanium nitride. The one or more metal materials of titanium, nickel, tungsten, and titanium nitride may improve conductivity of the metal conductive layer 170, thereby improving a transmission rate of the semiconductor structure. The material of the metal conductive layer 170 may alternatively include a metal semiconductor.

In some embodiments, when the material of the metal conductive layer 170 is the metal semiconductor material, a portion of the metal conductive layer 170 may serve as a drain of an active structure.

With reference to FIG. 5, a portion of the metal conductive layer 170 is etched to form lower electrode structures 180 arranged in an array in the first direction X and a second direction Y, where the first direction X is perpendicular to the surface of the substrate 100, and the second direction Y is parallel to the surface of the substrate 100. The metal conductive layer 170 is etched as the lower electrode structures 180, that is, a portion of original space occupied by the initial active layer is used to form a portion of a capacitor structure, thereby reducing the volume of the semiconductor structure and improving the spatial utilization of the semiconductor structure.

Figures 6, 7:
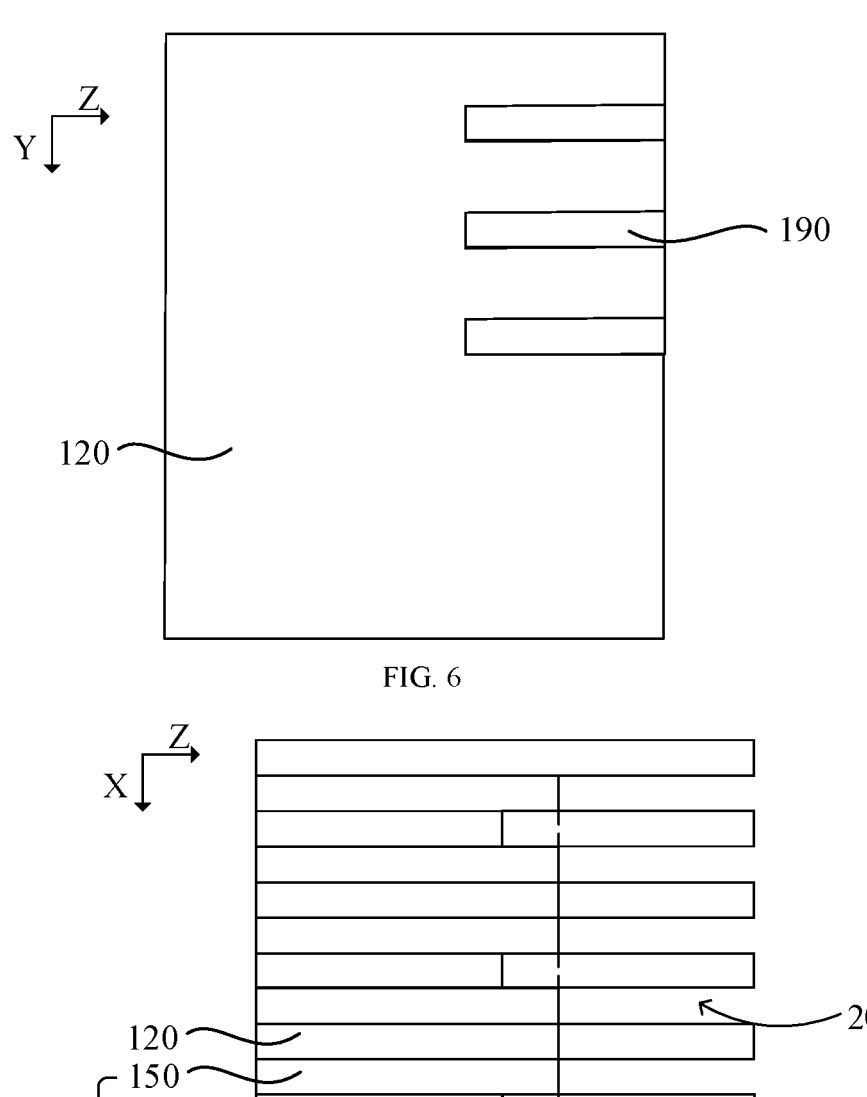

With reference to FIG. 6, in some embodiments, after etching the portion of the metal conductive layer 170, the method for fabricating a semiconductor structure may further include: forming a second isolation layer 190, the second isolation layer 190 being located between adjacent lower electrode structures 180 arranged in the second direction Y. The formed second isolation layer 190 may improve insulation between the adjacent lower electrode structures 180, and may also play a role in filling a semiconductor structure.

In some embodiments, the material of the second isolation layer 190 may be an insulating material such as silicon oxide or silicon nitride.

Figure 8:
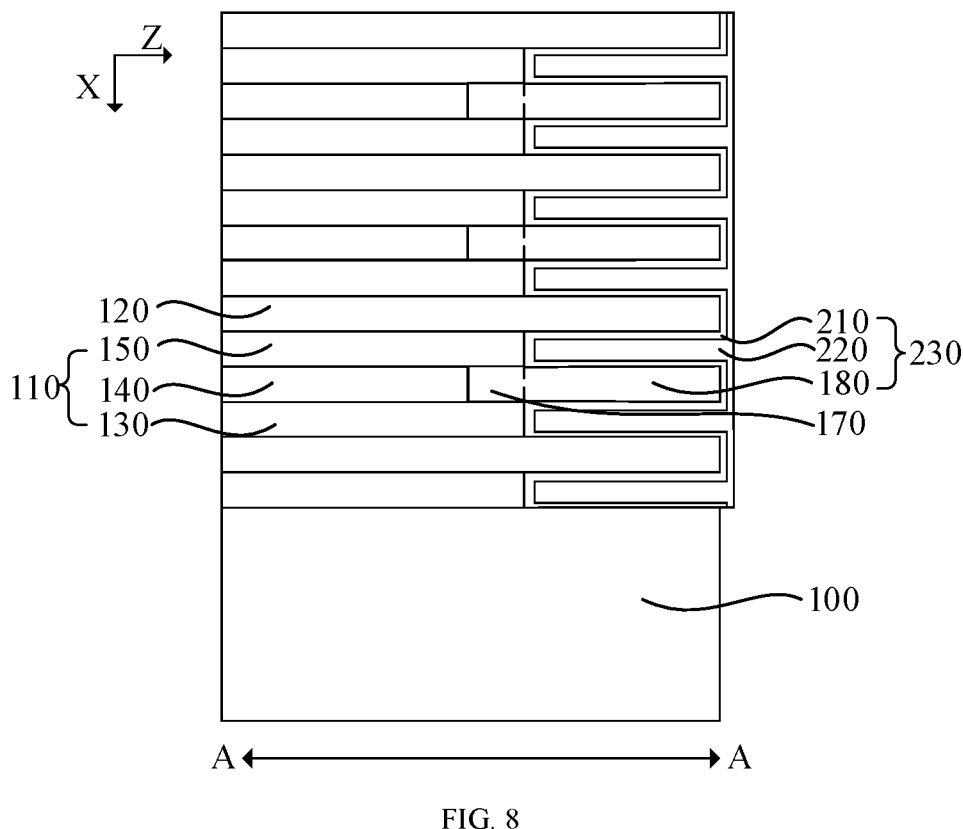
Figure 9:
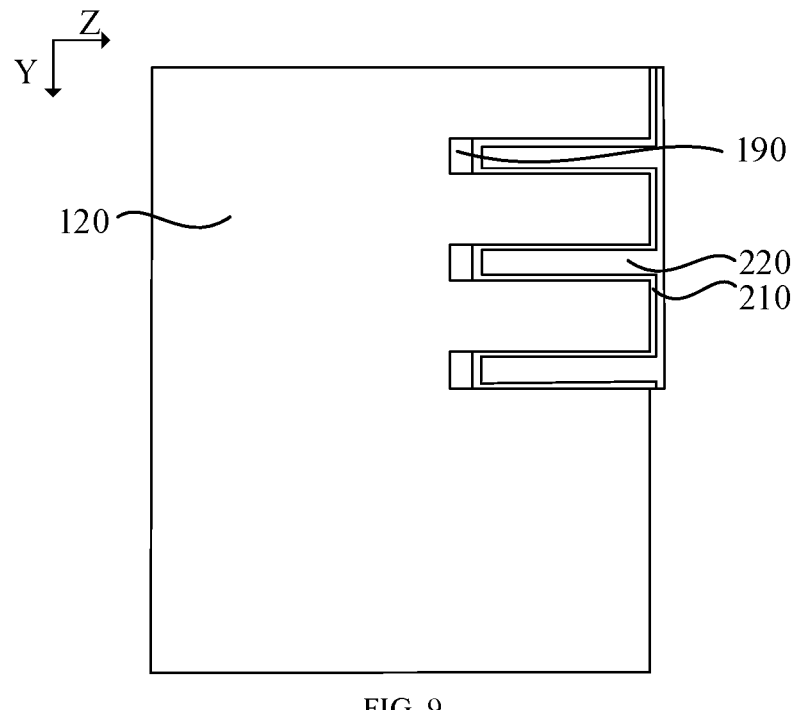

With reference to FIG. 7 to FIG. 9, in some embodiments, after forming the lower electrode structures 180, the method further includes: etching the first interlayer dielectric layer 130 and the second interlayer dielectric layer 150 on top and bottom surfaces of the lower electrode structure 180 to form a second trench 200, the second trench 200 exposing a portion of a surface of the lower electrode structure 180; forming a capacitor dielectric layer 210, the capacitor dielectric layer 210 covering an inner wall of the second trench 200; and forming upper electrode structures 220, where each upper electrode structure 220 is located on a surface of the capacitor dielectric layer 210 and completely fills the second trench 200, and the lower electrode structure 180, the capacitor dielectric layer 210, and the upper electrode structure 220 form a capacitor 230. The formation of the second trenches 200 provides a basis for the formation of the capacitor dielectric layer 210 and the upper electrode structures 220. The capacitor 230 is formed in different states to store data. For example, when the capacitor 230 storing charges may represent a '1' state of the semiconductor structure, and the capacitor 230 storing no charges may represent a '0' state of the semiconductor structure, where the '0' state may represent a low level, and the '1' state may represent a high level.

In some embodiments, the first interlayer dielectric layer 130 and the second interlayer dielectric layer 150 may be etched in a wet etching manner. Materials of the first interlayer dielectric layer 130 and the second interlayer dielectric layer 150 may be the same, so the second interlayer dielectric layer 150 and the first interlayer dielectric layer 130 on the top and bottom surfaces of the lower electrode structures 180 may be simultaneously etched in the same step, thereby reducing process steps of the method for fabricating a semiconductor structure, and ensuring consistency of the second trenches 200 above and below the lower electrode structures 180.

With reference to FIG. 7, in some embodiments, only a portion of the surface of the lower electrode structure 180 may be exposed in the etching process of the first interlayer dielectric layer 130 and the second interlayer dielectric layer 150. That is, a length of the first interlayer dielectric layer 130 removed by etching is less than that of the lower electrode structure 180, so that the surface of the formed capacitor dielectric layer will not be exposed in the subsequent process of etching the remained initial active layer 140, which may improve reliability of the semiconductor structure. In addition, lengths of the formed capacitor dielectric layer and upper electrode structures may be controlled by controlling the lengths of the etched first interlayer dielectric layer 130 and second interlayer dielectric layer 150, thereby avoiding contact between the capacitor dielectric layer and gates of active structures or word lines, and further improving the reliability of the semiconductor structure. In other embodiments, the length of the etched first interlayer dielectric layer or second interlayer dielectric layer may alternatively be equal to that of the metal conductive layer, thereby increasing the lengths of the capacitor dielectric layer and the upper electrode structures, increasing opposite areas of the lower electrode structures and the upper electrode structures of the semiconductor structure, and improving the performance of the semiconductor structure.

With reference to FIG. 8, a capacitor dielectric layer 210 and upper electrode structures 220 are formed. In some embodiments, the step of forming the capacitor dielectric layer may include: forming the capacitor dielectric layer 210 covering a side wall of the first isolation layer 120 to form capacitors 230 that share the capacitor dielectric layer 210 in the first direction X. The formation of the capacitors 230 that share the capacitor dielectric layer 210 in the first direction X may reduce process difficulty and process steps of the semiconductor structure. The capacitor dielectric layer 210 may be directly formed by deposition. In addition, the formation of the capacitors 230 that share the capacitor dielectric layer 210 in the first direction X may improve the spatial utilization of the semiconductor structure.

A material of the lower electrode structure 180 may include any one or any combination of metal materials such as titanium nitride, tantalum nitride, copper, or tungsten; a material of the capacitor dielectric layer 210 may include any one or any combination of ZrO, AlO, ZrNbO, ZrHfO, or ZrAlO; and a material of the upper electrode structure 220 includes a compound formed from one or two of metal nitrides and metal silicides, such as titanium nitride, titanium silicide, nickel silicide, titanium silicon nitride, or other conductive materials, or the material of the upper electrode structure 220 may alternatively be a conductive semiconductor material, such as polycrystalline silicon or silicon germanium.

It may be understood that the opposite area between the lower electrode structure 180 and the upper electrode structure 220 of the capacitor 230, the di stance between the lower electrode structure 180 and the upper electrode structure 220, and the material of the capacitor dielectric layer 210 may all affect the capacity of the capacitor 230. Therefore, the opposite area between the lower electrode structure 180 and the upper electrode structure 220 of the capacitor 230, the distance between the lower electrode structure 180 and the upper electrode structure 220, and the material of the capacitor dielectric layer 210 may be set according to actual requirements.

It may be understood that FIG. 9 is a top view of a structure corresponding to the schematic diagram of FIG. 8, does not involve any processing of the semiconductor structure corresponding to FIG. 8, and is only a schematic diagram of the semiconductor structure from a different perspective.

Figures 10, 11:
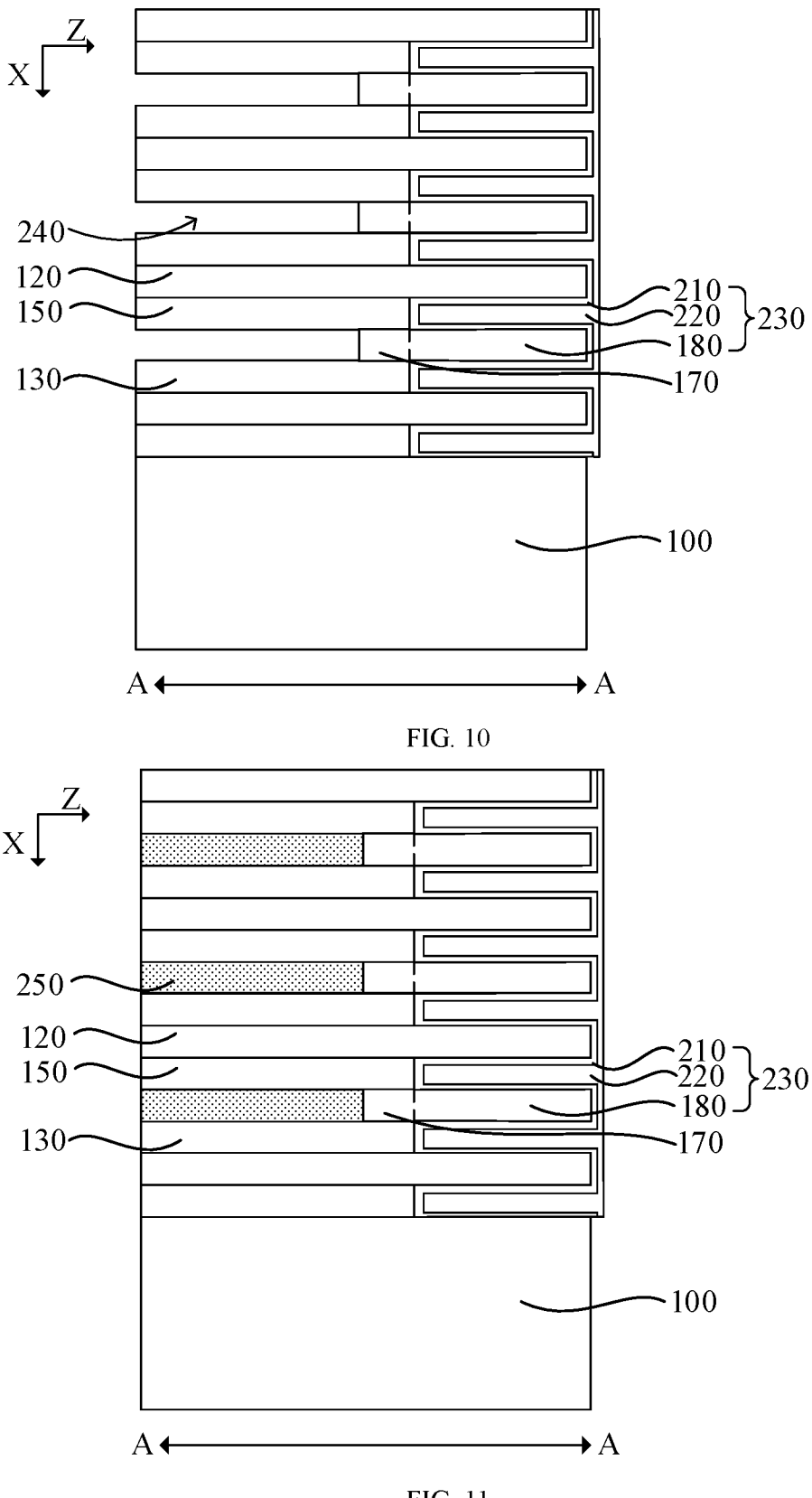

With reference to FIG. 10 and FIG. 11, after forming the lower electrode structures 180, the method further includes: etching the remained initial active layer 140 to form a third trench 240; and forming an oxide semiconductor layer 250, the oxide semiconductor layer 250 being located in the third trench 240, and the oxide semiconductor layer 250 being in contact connection with the remained metal conductive layer 170. The etching of the remained initial active layer 140 may provide a basis for subsequent formation of the oxide semiconductor layer 250, and the formed oxide semiconductor layer 250 may serve as an active structure of the semiconductor structure. The oxide semiconductor layer 250 serving as the active structure may improve mobility and activity of carriers in the active structure, thereby improving a response speed and performance of the semiconductor structure.

In some embodiments, a material of the oxide semiconductor layer 250 may include: indium gallium zinc oxide or zinc tin oxide. The indium gallium zinc oxide or zinc tin oxide as the material of the oxide semiconductor layer may improve ion mobility of the oxide semiconductor layer 250, thereby improving the performance of the subsequent oxide semiconductor layer 250 as a channel region. The material of the oxide semiconductor layer 250 may alternatively be one or more of other similar materials, such as indium zinc oxide, indium gallium silicon oxide, indium tungsten oxide, indium oxide, tin oxide, titanium oxide, magnesium zinc oxide, zirconium indium zinc oxide, hafnium indium zinc oxide, tin indium zinc oxide, aluminum tin indium zinc oxide, silicon indium zinc oxide, aluminum zinc tin oxide, gallium zinc tin oxide, or zirconium zinc tin oxide.

Figures 12, 13:
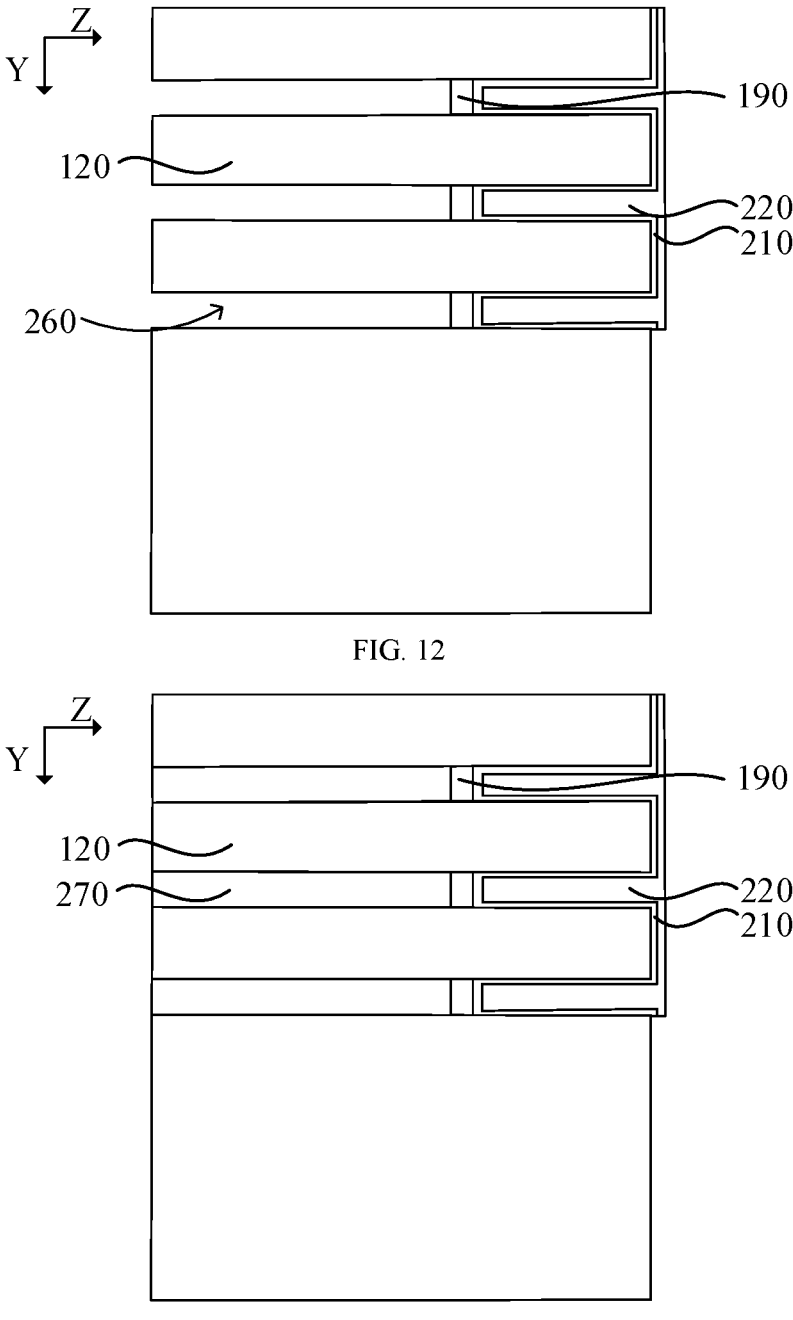

With reference to FIG. 12 and FIG. 13, after forming the oxide semiconductor layer 250, the method further includes: etching the oxide semiconductor layer 250 and the remained metal conductive layer 170 to form a fourth trench 260, the fourth trench 260 spacing the stacked structures 110 in the second direction Y. The fourth trench 260 corresponds to the second isolation layer 190 one to one, and the fourth trench 260 exposes an end face of the second isolation layer 190. Spaced active structures and capacitors 230 may be formed by etching the oxide semiconductor layer 250 and the remained metal conductive layer 170, where the spaced oxide semiconductor layer 250 serves as active structures, and the spaced metal conductive layer 170 serves as the lower electrode structures 180 of the capacitors 230.

In some embodiments, a third isolation layer 270 is formed after the fourth trench 260 is formed, the third isolation layer 270 completely filling the fourth trench 260. The formed third isolation layer 270 may isolate adjacent active structures to avoid an electrical connection between the adjacent active structures, thereby improving the reliability of the semiconductor structure.

With reference to FIG. 14 to FIG. 21, after forming the oxide semiconductor layer 250, the method further includes: forming word lines 280, each word line 280 surrounding a surface of the oxide semiconductor layer 250, and the word line 280 extending in either the first direction X or the second direction Y; and forming bit lines 290, each bit line 290 surrounding the surface of the oxide semiconductor layer 250, the bit line 290 being spaced apart from the word line 280, and the bit line 290 extending in the other direction of the first direction X or the second direction Y. The formation of the word line 280 surrounding the surface of the oxide semiconductor layer 250 may increase the contact area between the word line 280 and the oxide semiconductor layer 250, thereby increasing the controllability of the word line 280 over the oxide semiconductor layer 250. The formation of the bit line surrounding the oxide semiconductor layer 250 may reduce the contact resistance between bit line 290 and the oxide semiconductor layer 250, thereby improving the performance of the semiconductor structure.

With reference to FIG. 14 to FIG. 19, a method for forming the word lines 280 may include: forming first word lines 281, each first word line 281 surrounding the surface of the oxide semiconductor layer 250; and forming second word lines 282, each second word line 282 covering a side wall, arranged in the second direction Y, of the first word line 281. The formed first word line 281 surrounding the oxide semiconductor layer 250 may increase the contact area between the word line 280 and the oxide semiconductor layer 250, and the formed second word line 282 may provide a contact basis for subsequent formation of a conductive column correspondingly connected to the word line 280. In other embodiments, the first word line may cover only a portion of a surface of the active structure. For example, the active structure is cuboid, and the first word line may only cover top and bottom surfaces of the active structure, or cover top and bottom surfaces of the active structure and one of the sides connected to the top and bottom surfaces.

Figure 14:
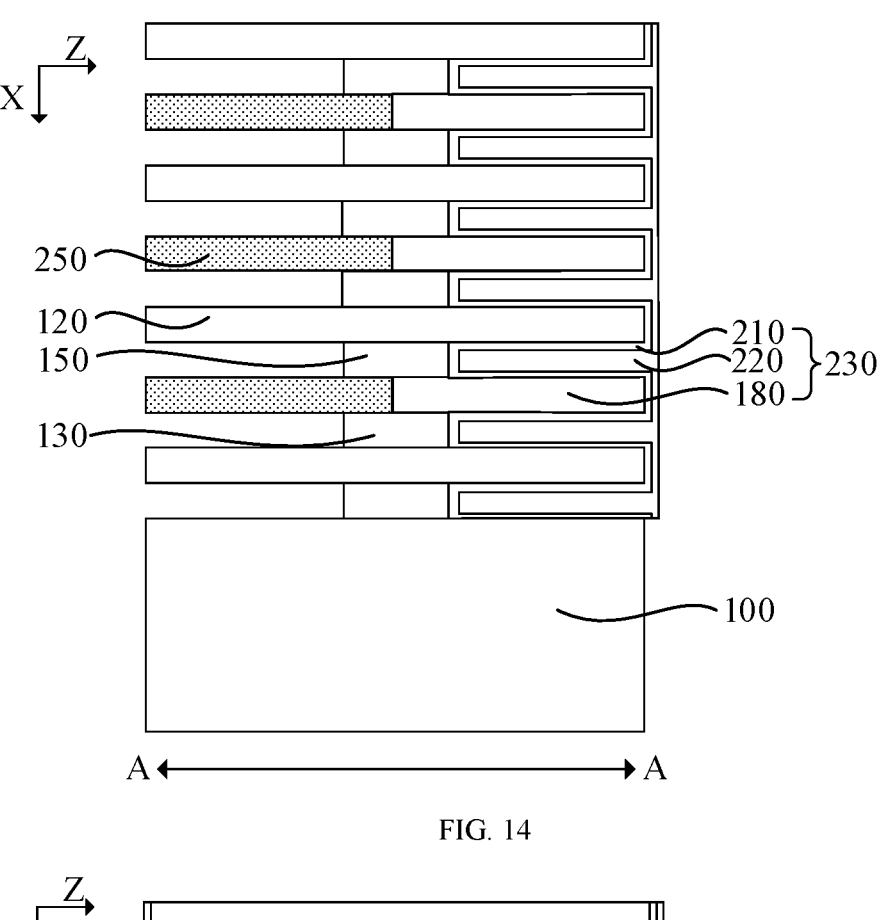

With reference to FIG. 14, portions of the first interlayer dielectric layer 130 and the second interlayer dielectric layer 150 are etched to expose the surface of the oxide semiconductor layer 250, thereby providing a process basis for subsequent formation of word lines. The remained first interlayer dielectric layer 130 and second interlayer dielectric layer 150 may serve as isolation structures between the word lines and the capacitors 230, thereby avoiding direct contact between the word lines and the capacitors 230 and improving the reliability of the semiconductor structure.

Figure 15:
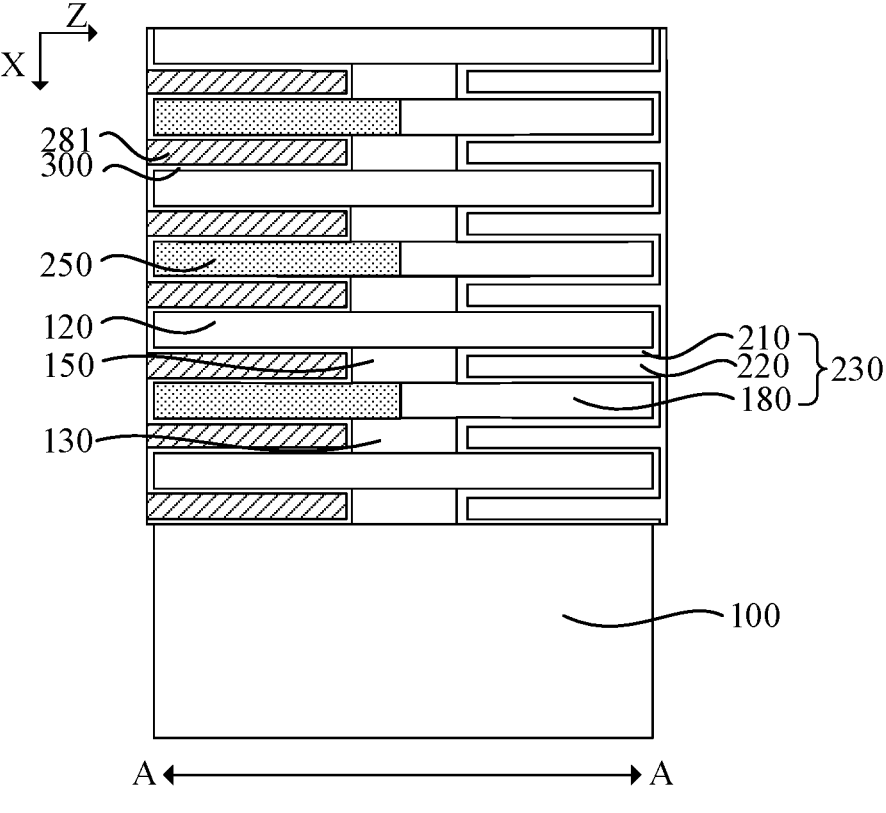

With reference to FIG. 15, before forming the first word lines 281, the method further includes: forming a gate dielectric layer 300, the gate dielectric layer 300 covering the surface of the exposed oxide semiconductor layer 250, the surfaces of the remained first interlayer dielectric layer 130 and second interlayer dielectric layer 150, and the surface of the first isolation layer 120. The formed gate dielectric layer 300 may avoid direct contact between the first word lines 281 and the oxide semiconductor layer 250, thereby avoiding abnormalities of the semiconductor structure.

In some embodiments, the material of the gate dielectric layer 300 may be an insulating material such as silicon oxide, silicon nitride, or hafnium oxide. The material of the gate dielectric layer 300 may be selected according to a dielectric constant required by the gate dielectric layer 300.

In some embodiments, the gate dielectric layer 300 may have a thickness of 8-20 nm. It may be understood that, under the same other conditions, the thinner gate dielectric layer 300 indicates better performance of the semiconductor structure, but lower reliability of the semiconductor structure and more likely occurrence of a current tunneling effect, while the thicker gate dielectric layer 300 indicates higher reliability of the semiconductor structure, but lower performance of the semiconductor structure. The gate dielectric layer 300 having the thickness of 8-20 nm may improve the performance of the semiconductor structure and ensure certain reliability thereof.

The formed gate dielectric layer 300 and first isolation layer 120 may further help the oxide semiconductor layer 250 isolate oxygen and water vapor in the air, thereby improving the reliability of the semiconductor structure.

In some embodiments, the method further includes: forming first word lines 281, where each first word line 281 is opposite to the exposed oxide semiconductor layer 250, and the gate dielectric layer 300 is further included between the first word line 281 and the oxide semiconductor layer 250.

Figures 16, 17:
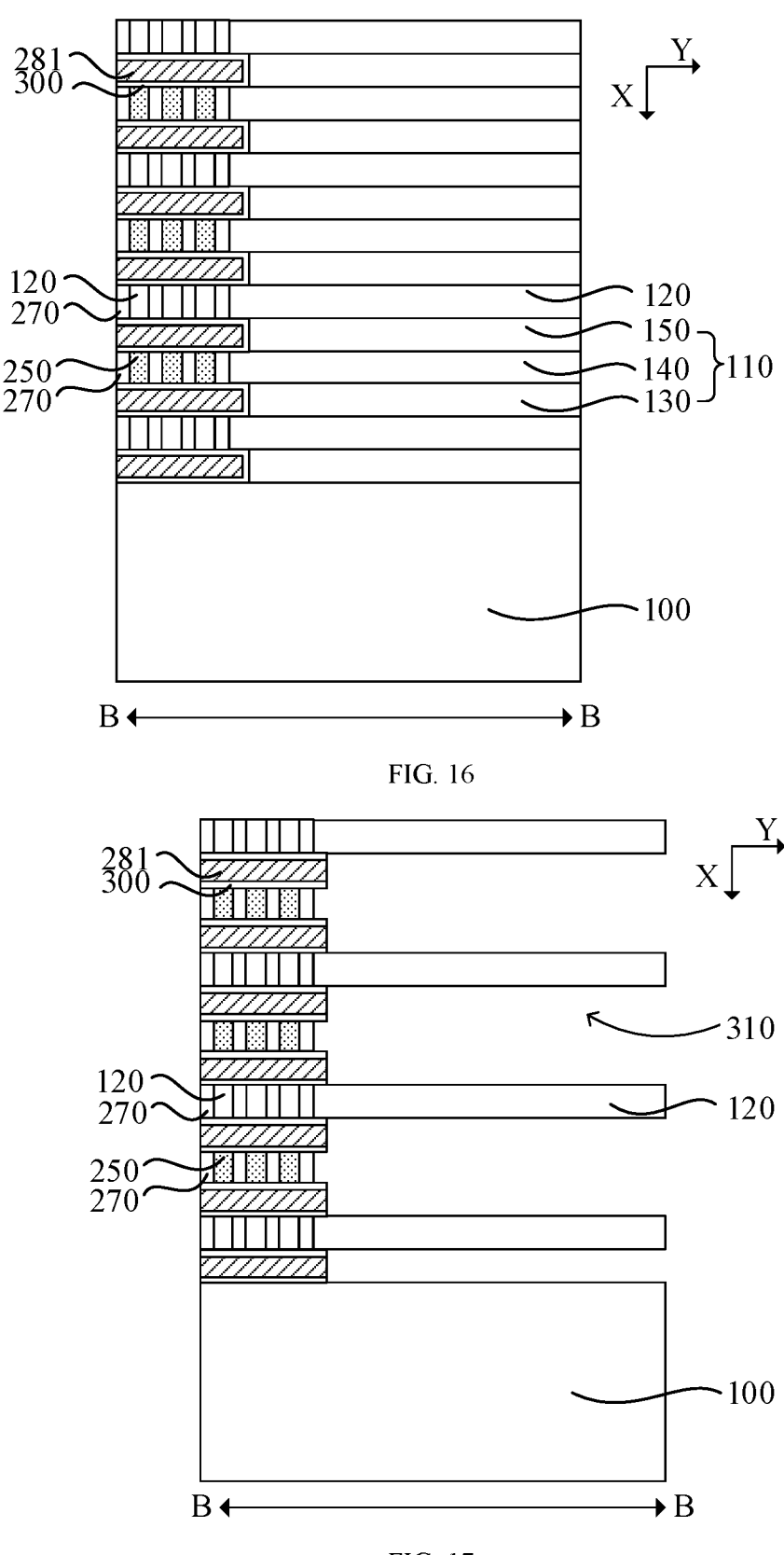

Refer to FIG. 16. FIG. 16 is a cross-sectional view taken in a BB direction in FIG. 1. FIG. 16 does not include any process steps based on FIG. 15, but is only a cross-sectional view of the semiconductor structure from a different perspective.

With reference to FIG. 17, the stacked structure 110 is etched in the second direction Y to form a fifth trench 310, the fifth trench 310 exposing a side wall of the first word line

281. The formation of the fifth trench 310 may provide a process basis for the formation of a second word line.

Figures 18, 19:
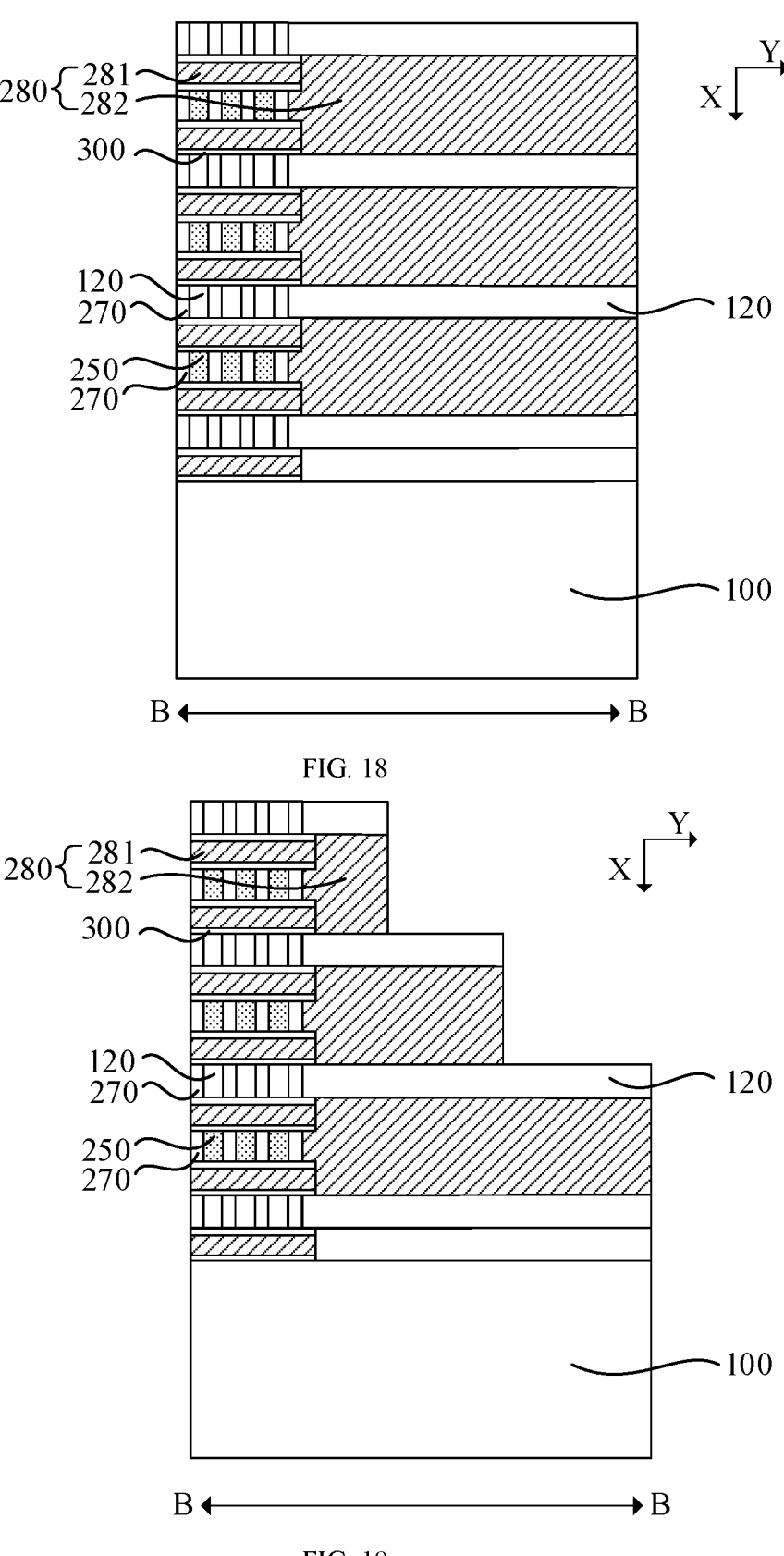

With reference to FIG. 18, second word lines 282 are formed, the second word line 282 completely filling the fifth trench 310.

With reference to FIG. 19, the second word line 282 and the first isolation layer 120 are etched. In some embodiments, lengths of the second word lines 282 arranged in the first direction X decrease sequentially in the second direction Y, that is, the lengths of the second word lines 282 decrease sequentially from a direction near the substrate 100 to a direction away from the substrate 100. Three second word lines 282 in the figure are used as an example. The second word line 282 closest to the substrate 100 is referred to as a first sub word line, the second word line 282 in the middle is referred to as a second sub word line, and the second word line 282 farthest from the substrate 100 is referred to as a third sub word line. In the second direction, the length of the first sub word line is greater than the length of the second sub line and greater than the length of the third sub word line, whereby a conductive column may be formed on the portion of the first sub word line longer than the second sub word line, and a conductive column may be formed on the portion of the second sub word line longer than the third sub word line. Consequently, signals of different word lines 280 may be led out, or corresponding electrical signals may be provided to different word lines 280.

Figure 20:
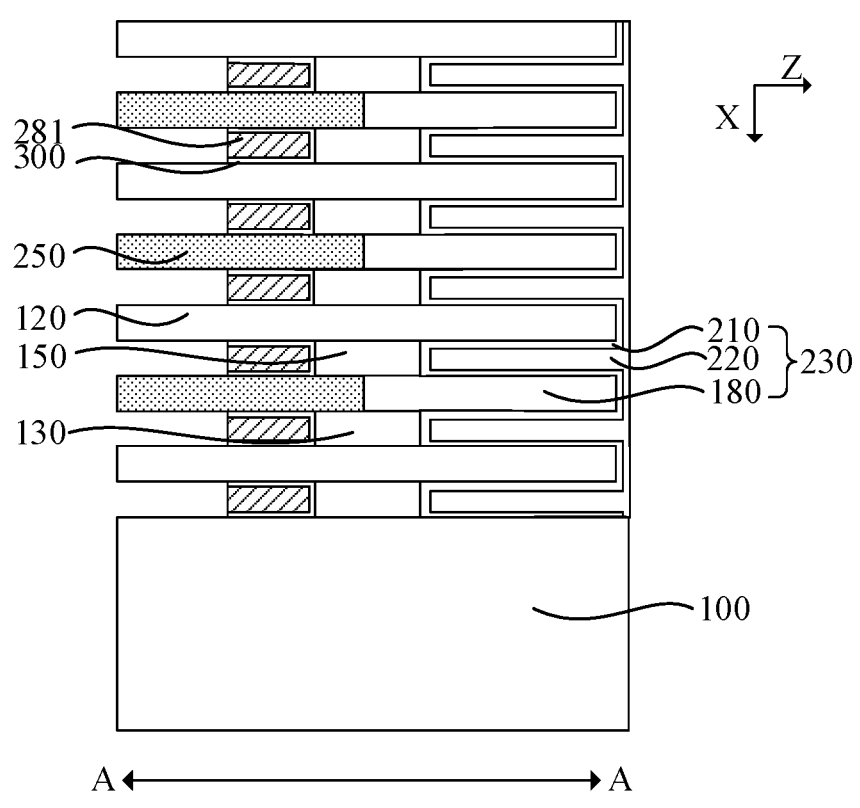

With reference to FIG. 20, portions of the first word line 281 and the gate dielectric layer 300 are etched to expose a portion of the surface of the oxide semiconductor layer 250, thereby providing a process basis for subsequent formation of bit lines.

Figure 21:
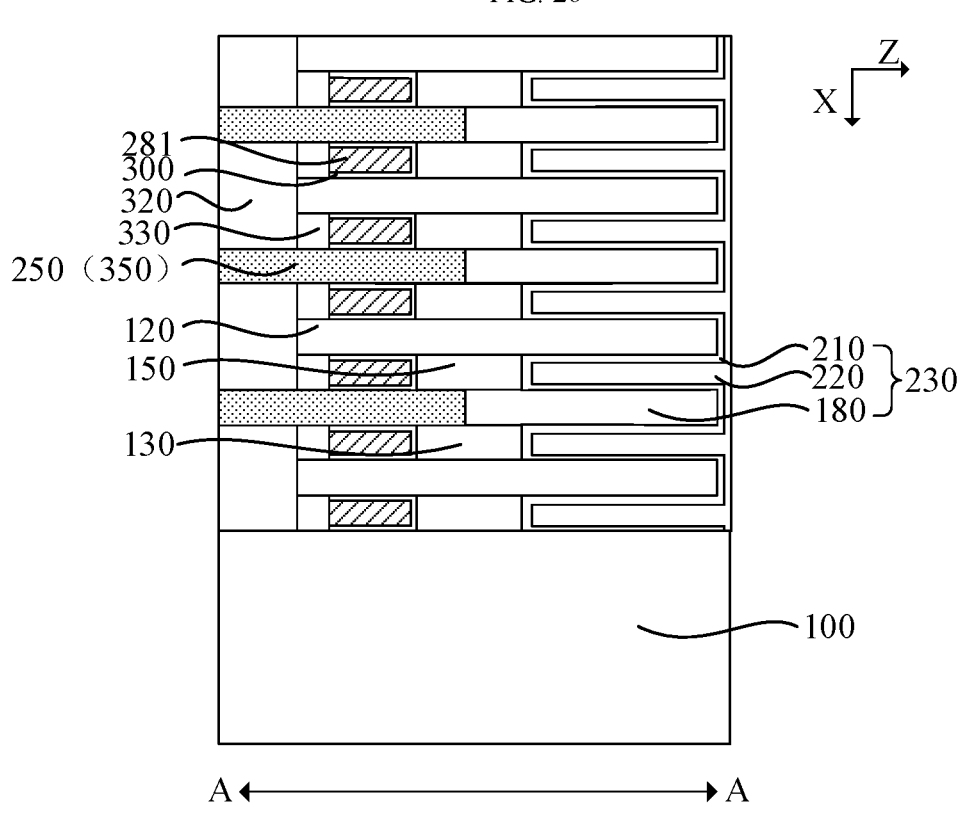

With reference to FIG. 21, bit lines 320 are formed. The bit lines 320 are formed to provide a basis for data read and data write of the semiconductor structure.

In some embodiments, the bit lines 320 extend in the first direction as an example. A bit line 320 may be in contact with a plurality of oxide semiconductor layers 250 arranged in the first direction, that is, a bit line 320 may transmit signals to a plurality of oxide semiconductor layers 250 arranged in the first direction X, thereby improving the stacking density of the semiconductor structure and improving the spatial utilization of the semiconductor structure.

However, it may be understood that the extension direction of the bit lines 320 intersects with the extension direction of the word lines 280, and there is only one intersection point between one bit line 320 and one word line 280, that is, one oxide semiconductor layer 250 may be selected through one word line 280 and one bit line 320.

In some embodiments, before forming the bit lines 320, the method further includes: forming a fourth isolation layer 330, the fourth isolation layer 330 covering the surface of a portion of the oxide semiconductor layer 250, and the fourth isolation layer 330 being in contact connection with a side wall, arranged in a third direction Z, of the word line 280. The formed fourth isolation layer 330 may isolate the bit line 320 from the word line 280, thereby avoiding an electrical connection between the bit line 320 and the word line 280 and improving the reliability of the semiconductor structure.

In some embodiments, a fourth initial isolation layer is formed, the fourth initial isolation layer being located between the first isolation layer 120 and the oxide semiconductor layer 250; and the fourth initial isolation layer is etched, the remained fourth initial isolation layer serving as the fourth isolation layer 330.

In some embodiments, the method further includes etching the first isolation layer 120 while etching the fourth initial isolation layer. In the process of forming bit lines 320, the formed bit line 320 may further cover a side wall of the first isolation layer 120.

Figure 22:
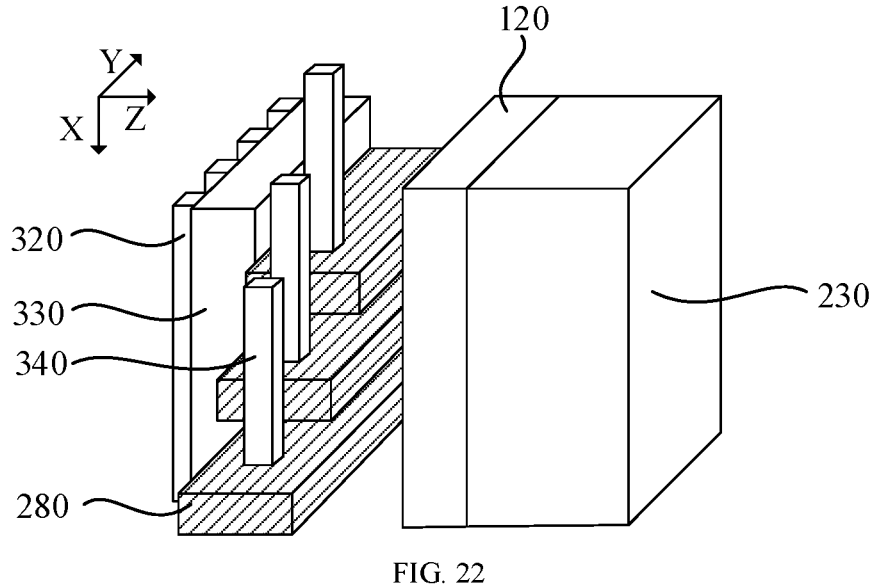

With reference to FIG. 1 and FIG. 22, the method for fabricating a semiconductor structure further includes: forming conductive columns 340, a conductive column 340 being correspondingly connected to a word line 280. An electrical signal may be provided to the conductive column 340 to control on or off of the word line 280. Signals are provided to different conductive columns 340, so as to provide electrical signals to the word lines 280 connected to the conductive columns 340. That is, different conductive columns 340 may be controlled to control different word lines 280.

In the embodiment of the present disclosure, stacked structures 110 spaced in a first direction X and a first isolation layer 120 between adjacent stacked structures 110 are formed on a surface of a substrate 100, an initial active layer 140 is etched to form a first trench 160, a metal conductive layer 170 is formed in the first trench 160, and the metal conductive layer 170 is etched to form lower electrode structures 180 arranged in an array, where the etching of the initial active layer 140 and the formation of the lower electrode structures 180 may reduce a volume of a semiconductor structure and improve spatial utilization of the semiconductor structure.

An embodiment of the present disclosure further provides a semiconductor structure, which may be formed through some of or all of the steps of the foregoing method for fabricating a semiconductor structure. The same or corresponding parts may refer to the foregoing embodiment, and will not be repeated below. The semiconductor structure provided by the embodiment of the present disclosure will be explained below with reference to the accompanying drawings.

With reference to FIGS. 1, 19, 21, and 22, the semiconductor structure includes: a substrate 100; active structures 350 located on a surface of the substrate 100 and arranged at intervals in a first direction X and a second direction Y, the first direction X being perpendicular to the surface of the substrate 100, and the second direction Y being parallel to the surface of the substrate 100; lower electrode structures 180 arranged at intervals in the first direction X and the second direction Y, each lower electrode structure 180 being in contact connection with an active structure 350; and a first isolation layer 120, the first isolation layer 120 being located between adjacent active structures 350 in the first direction X, and a projection of the active structure 350 on the surface of the substrate 100 partially overlapping with that of the first isolation layer 120 on the surface of the substrate 100.

In some embodiments, the semiconductor structure further includes a capacitor dielectric layer 210 and upper electrode structures 220, the capacitor dielectric layer 210 including a first side, a second side, and a third side, where the first side is in contact connection with top and bottom surfaces of the lower electrode structure 180; the second side is opposite to the first side and is spaced apart from the first side; the third side is in contact connection with side walls, arranged in a third direction, of the first side and the second side, and the first side, the second side, and the third side enclose an accommodating space; the upper electrode structure 220 is in contact connection with the first side, the second side, and the third side, and the upper electrode structure 220 completely fills the accommodating space; and the lower electrode structure 180, the capacitor dielectric layer 210, and the upper electrode structure 220 form a capacitor 230. That is, the capacitor dielectric layer 210 covers a portion of a surface of the lower electrode structure 180, the capacitor dielectric layer 210 covers side walls of the first interlayer dielectric layer 130 and the second interlayer dielectric layer 130, and the capacitor dielectric layer 210 further covers a surface of the first isolation layer 120. The upper electrode structure 220 covers a surface of the capacitor dielectric layer 210. The distance between the lower electrode structure 180 and the upper electrode structure 220 of the capacitor 230 and the material of the capacitor dielectric layer 210 may affect the capacity of the capacitor 230. Therefore, the distance between the lower electrode structure 180 and the upper electrode structure 220 of the capacitor 230, the opposite area between the lower electrode structure 180 and the upper electrode structure 220, and the material of the capacitor dielectric layer 210 may be set according to actual requirements.

In some embodiments, the capacitor dielectric layer 210 may further cover a side wall of the first isolation layer 120 to form capacitors 230 that share the capacitor dielectric layer 210 in the first direction X. The capacitor dielectric layer 210 covers the side wall of the first isolation layer 120 to reduce process steps of the semiconductor structure, and the capacitors 230 that share the capacitor dielectric layer 210 may improve spatial utilization of the semiconductor structure.

In some embodiments, a projection of the upper electrode structure 220 on the substrate 100 is located within a projection of the lower electrode structure 180 within the substrate 100. That is, in the third direction Z, a length of the upper electrode structure 220 is less than that of the lower electrode structure 180. Setting the length of the upper electrode structure 220 to be less than that of the lower electrode structure 180 may reduce fabricating difficulty of the semiconductor structure, and may avoid exposure of the capacitor dielectric layer 210 in a process of forming word lines 280, thereby improving reliability of the semiconductor structure.

In some embodiments, a material of the active structures 350 may be an oxide semiconductor. The oxide semiconductor as the material of the active structures 350 may improve activity of carriers within the active structures 350, thereby improving mobility of the carriers within the active structures 350. It may be understood that the active structure 350 corresponds to the oxide semiconductor layer 250 in the foregoing method for fabricating a semiconductor structure.

In some embodiments, the semiconductor structure may further include: word lines 280, each word line 280 surrounding a surface of the active structure 350, and the word line 280 extending in either the first direction X or the second direction Y; and bit lines 320, each bit line 320 surrounding the surface of the active structure 350, the bit line 320 being spaced apart from the word line 280, and the bit line 320 extending in the other direction of the first direction X or the second direction Y. The word line 280 surrounding the surface of the active structure 350 may control conduction of the active structure 350, and read and write of the semiconductor structure may be implemented through the bit line 320 surrounding the surface of the active structure 350.

In some embodiments, the semiconductor structure further includes: a gate dielectric layer 300, the gate dielectric layer 300 being located on the surface of the active structure 350. The formed gate dielectric layer 300 may avoid direct contact between the word line 280 and the active structure 350, thereby avoiding abnormalities of the semiconductor structure.

In some embodiments, the word lines 280 include first word lines 281 and second word lines 282, each first word line 281 surrounding the active structure 350, and each second word line 282 covering a side wall of the first word line 281. The formed first word line 281 surrounding the active structure 350 may increase the contact area between the word line 280 and the active structure 350, and the formed second word line 282 may provide a contact basis for subsequent formation of a conductive column correspondingly connected to the word line 280.

In some embodiments, the first word line 281 surrounds a surface of the gate dielectric layer 300.

In some embodiments, the semiconductor structure further includes: a first interlayer dielectric layer 130 and a second interlayer dielectric layer 150. The first interlayer dielectric layer 130 and the second interlayer dielectric layer 150 may improve insulation of the capacitor 230 and the word line 280, and may also support the semiconductor structure to avoid deformation of the semiconductor structure and improve the reliability of the semiconductor structure.

In some embodiments, the semiconductor structure may further include: a third isolation layer 270, the third isolation layer 270 being located between adjacent active structures 350 in the second direction Y. The third isolation layer 270 may isolate adjacent active structures 350 to avoid an electrical connection between the adjacent active structures 350, thereby improving the reliability of the semiconductor structure.

In some embodiments, the semiconductor structure may further include: a fourth isolation layer 330, the fourth isolation layer 330 covering the surface of a portion of the active structure 350, and the fourth isolation layer 330 being in contact connection with a side wall, arranged in the third direction Z, of the word line 280. The formed fourth isolation layer 330 may isolate the bit line 320 from the word line 280, thereby avoiding an electrical connection between the bit line 320 and the word line 280 and improving the reliability of the semiconductor structure.

In some embodiments, the semiconductor structure may further include: conductive columns 340, a conductive column 340 being correspondingly connected to a word line 280. An electrical signal may be provided to the conductive column 340 to control on or off of the word line 280. Signals are provided to different conductive columns 340, so as to provide electrical signals to the word lines 280 connected to the conductive columns 340. That is, different conductive columns 340 may be controlled to control different word lines 280.

In the embodiment of the present disclosure, the active structure 350 is located on the surface of the substrate 100, the lower electrode structure 180 is in contact connection with the active structure 350, the first isolation layer 120 is located between adjacent active structures 350, and the projection of the active structure 350 on the surface of the substrate 100 partially overlaps with the projection of the first isolation layer 120 on the surface of the substrate 100, that is, the length of the active structure 350 is less than that of the first isolation layer 120, whereby the volume of the semiconductor structure may be reduced and the spatial utilization of the semiconductor structure may be improve.

Those of ordinary skill in the art may understand that the foregoing implementations are specific embodiments for implementing the present disclosure, and in actual applications, various changes may be made in form and details without departing from the spirit and scope of the present disclosure. Any person skilled in the art may make various changes and modifications without departing from the spirit and scope of the present disclosure. Therefore, the protection scope of the present disclosure shall be subject to the scope of the claims.

What is claimed is:

1. A method for fabricating a semiconductor structure, comprising:

providing a substrate;

forming, on a surface of the substrate, stacked structures arranged at intervals in a first direction and a first isolation layer located between adjacent stacked structures, each stacked structure comprising a first interlayer dielectric layer, an initial active layer, and a second interlayer dielectric layer;

etching a portion of the initial active layer to form a first trench;

forming a metal conductive layer in the first trench, the metal conductive layer being in contact connection with the remained initial active layer; and etching a portion of the metal conductive layer to form lower electrode structures arranged in an array in the first direction and a second direction, wherein the first direction is perpendicular to the surface of the substrate, and the second direction is parallel to the surface of the substrate.

2. The method for fabricating a semiconductor structure according to claim 1, wherein after forming the lower electrode structures, the method further comprises:

etching the first interlayer dielectric layer and the second interlayer dielectric layer on top and bottom surfaces of the lower electrode structure to form a second trench, the second trench exposing a portion of a surface of the lower electrode structure;

forming a capacitor dielectric layer, the capacitor dielectric layer covering an inner wall of the second trench; and forming upper electrode structures, wherein each upper electrode structure is located on a surface of the capacitor dielectric layer and completely fills the second trench, and the lower electrode structure, the capacitor dielectric layer, and the upper electrode structure form a capacitor.

3. The method for fabricating a semiconductor structure according to claim 2, wherein the step of forming the capacitor dielectric layer comprises: forming the capacitor dielectric layer covering a side wall of the first isolation layer to form capacitors that share the capacitor dielectric layer in the first direction.

4. The method for fabricating a semiconductor structure according to claim 1, wherein after forming the lower electrode structures, the method further comprises:

etching the remained initial active layer to form a third trench; and forming an oxide semiconductor layer, the oxide semiconductor layer being located in the third trench, and the oxide semiconductor layer being in contact connection with the remained metal conductive layer.

5. The method for fabricating a semiconductor structure according to claim 4, wherein after forming the oxide semiconductor layer, the method further comprises:

etching the oxide semiconductor layer and the remained metal conductive layer to form a fourth trench, the fourth trench spacing the stacked structures in the second direction.

6. The method for fabricating a semiconductor structure according to claim 5, wherein after etching the portion of the metal conductive layer, the method for fabricating a semiconductor structure further comprises: forming a second isolation layer, the second isolation layer being located between adjacent lower electrode structures arranged in the second direction; and forming a third isolation layer after forming the fourth trench, the third isolation layer completely filling the fourth trench.

7. The method for fabricating a semiconductor structure according to claim 4, wherein a material of the oxide semiconductor layer comprises indium gallium zinc oxide or zinc tin oxide.

8. The method for fabricating a semiconductor structure according to claim 4, wherein after forming the oxide semiconductor layer, the method further comprises: forming word lines, each word line surrounding a surface of the oxide semiconductor layer, and each word line extending in either the first direction or the second direction; and forming bit lines, each bit line surrounding the surface of the oxide semiconductor layer, the bit line being spaced apart from the word line, and the bit line extending in the other direction of the first direction or the second direction.

9. The method for fabricating a semiconductor structure according to claim 8, wherein a method for forming the word lines comprises:

forming first word lines, each first word line surrounding the surface of the oxide semiconductor layer; and forming second word lines, each second word line covering a side wall, arranged in the second direction, of the first word line.

10. The method for fabricating a semiconductor structure according to claim 1, wherein the metal conductive layer comprises one or more metal materials of titanium, nickel, tungsten, and titanium nitride.

11. A semiconductor structure, comprising:

a substrate;

active structures located on a surface of the substrate and arranged at intervals in a first direction and a second direction, the first direction being perpendicular to the surface of the substrate, and the second direction being parallel to the surface of the substrate;

14 lower electrode structures arranged at intervals in the first direction and the second direction, each lower electrode structure being in contact connection with an active structure; and a first isolation layer, the first isolation layer being located between adjacent active structures in the first direction, and a projection of the active structure on the surface of the substrate partially overlapping with that of the first isolation layer on the surface of the substrate.

12. The semiconductor structure according to claim 11, further comprising a capacitor dielectric layer and upper electrode structures, the capacitor dielectric layer comprising a first side, a second side, and a third side, wherein the first side is in contact connection with top and bottom surfaces of the lower electrode structure; the second side is opposite to the first side and is spaced apart from the first side; the third side is in contact connection with side walls, arranged in a third direction, of the first side and the second side, and the first side, the second side, and the third side enclose an accommodating space; and the upper electrode structure is in contact connection with the first side, the second side, and the third side, and the upper electrode structure completely fills the accommodating space; and the lower electrode structure, the capacitor dielectric layer, and the upper electrode structure form a capacitor.

13. The semiconductor structure according to claim 12, wherein a projection of the upper electrode structure on the substrate is located within a projection of the lower electrode structure within the substrate.

14. The semiconductor structure according to claim 11, wherein a material of the active structures comprises an oxide semiconductor.

15. The semiconductor structure according to claim 11, further comprising: word lines, each word line surrounding a surface of the active structure, and the word line extending in either the first direction or the second direction; and bit lines, each bit line surrounding the surface of the active structure, the bit line being spaced apart from the word line, and the bit line extending in the other direction of the first direction or the second direction.

* * * * *